(12) United States Patent
Elliot et al.

(10) Patent No.: US 10,991,616 B2
(45) Date of Patent: Apr. 27, 2021

(54) HIGH SPEED LOW TEMPERATURE METHOD FOR MANUFACTURING AND REPAIRING SEMICONDUCTOR PROCESSING EQUIPMENT AND EQUIPMENT PRODUCED USING SAME

(71) Applicant: Component Re-Engineering Company, Inc., Santa Clara, CA (US)

(72) Inventors: Alfred Grant Elliot, Palo Alto, CA (US); Brent Donald Alfred Elliot, Cupertino, CA (US); Frank Balma, Los Gatos, CA (US); Richard Erich Schuster, Milpitas, CA (US); Dennis George Rex, Williams, OR (US); Alexander Veytser, Mountain View, CA (US)

(73) Assignee: Watlow Electric Manufacturing Company, St. Louis, MO (US)

( * ) Notice: Subject to any disclaimer, the term of this patent is extended or adjusted under 35 U.S.C. 154(b) by 0 days.

(21) Appl. No.: 16/215,526

(22) Filed: Dec. 10, 2018

(65) Prior Publication Data
US 2020/0185262 A1    Jun. 11, 2020

Related U.S. Application Data

(63) Continuation of application No. 14/543,376, filed on Nov. 17, 2014, which is a continuation of application
(Continued)

(51) Int. Cl.
*H01L 21/67* (2006.01)
*H01L 21/687* (2006.01)
*H01L 21/683* (2006.01)

(52) U.S. Cl.
CPC .. *H01L 21/68785* (2013.01); *H01L 21/67103* (2013.01); *H01L 21/6833* (2013.01); *H01L 21/68792* (2013.01)

(58) Field of Classification Search
CPC ......... B23P 11/00; B23P 11/025; B23P 15/46; B23P 19/00; B23P 19/04; B23P 19/10;
(Continued)

(56) References Cited

U.S. PATENT DOCUMENTS 5,447,683 A * 9/1995 Montgomery ........... B23K 1/19
148/423
6,884,511 B1 * 4/2005 Rossing ................ C04B 35/565
428/426
(Continued)

FOREIGN PATENT DOCUMENTS

DE    102009060938    6/2011
JP       102047236    2/1990
(Continued)

*Primary Examiner* — Lee D Wilson
(74) *Attorney, Agent, or Firm* — Burris Law, PLLC

(57) ABSTRACT

A method for the joining of ceramic pieces into an assembly adapted to be used in semiconductor processing. The joined pieces are adapted to withstand the environments within a process chamber during substrate processing, chamber cleaning processes, and the oxygenated atmosphere which may be seen within the shaft of a heater or electrostatic chuck. The ceramic pieces may be aluminum nitride and the pieces may be brazed with aluminum. The joint material is adapted to withstand both the environments within a process chamber during substrate processing, and the oxygenated atmosphere which may be seen within the shaft of a heater or electrostatic chuck. The joint is adapted to provide a hermetic seal across the joint. The joined pieces are adapted to be separated at a later time should rework or replacement of one of the pieces be desired.

7 Claims, 14 Drawing Sheets

Related U.S. Application Data

No. 13/543,727, filed on Jul. 6, 2012, now Pat. No. 8,932,690.

(60) Provisional application No. 61/565,396, filed on Nov. 30, 2011, provisional application No. 61/592,587, filed on Jan. 30, 2012, provisional application No. 61/605,707, filed on Mar. 1, 2012, provisional application No. 61/658,896, filed on Jan. 12, 2012.

(58) Field of Classification Search
CPC ......... H01L 21/67103; H01L 21/68785; H01L 21/6833; H01L 21/68792
See application file for complete search history.

(56) References Cited

U.S. PATENT DOCUMENTS

| | | | |
|---|---|---|---|
| 7,735,718 B2* | 6/2010 | Graham | B23K 35/002 228/262.51 |
| 7,857,194 B2* | 12/2010 | Kramer | B32B 7/04 228/122.1 |
| 10,153,183 B2* | 12/2018 | Elliot | B23K 1/0016 |
| 10,384,283 B2* | 8/2019 | Elliot | B23K 35/302 |
| 10,471,531 B2* | 11/2019 | Elliot | B23K 35/36 |
| 2008/0305356 A1 | 12/2008 | Weil et al. | |
| 2011/0288648 A1 | 11/2011 | Fellows et al. | |
| 2013/0186940 A1* | 7/2013 | Elliot | B23K 1/0016 228/121 |
| 2015/0287620 A1* | 10/2015 | Elliot | B23K 1/19 219/444.1 |
| 2016/0184912 A1* | 6/2016 | Elliot | B23K 35/286 228/121 |
| 2016/0185672 A1* | 6/2016 | Elliot | B23K 1/0016 156/89.27 |
| 2017/0240475 A1* | 8/2017 | Elliot | C04B 37/001 |
| 2019/0291199 A1* | 9/2019 | Elliot | C04B 35/581 |

FOREIGN PATENT DOCUMENTS

| | | |
|---|---|---|
| JP | H02088482 | 3/1990 |
| JP | H06115009 | 4/1994 |
| JP | 2001342079 | 12/2001 |
| JP | 2005247662 | 9/2005 |
| JP | 2006225260 | 8/2006 |
| JP | 2007043042 | 2/2007 |
| JP | 2008153194 | 7/2008 |
| JP | 2009141204 | 6/2009 |
| JP | 5951791 | 7/2016 |
| JP | 6383382 | 8/2018 |
| WO | 2008048999 | 4/2008 |

* cited by examiner

HIGH SPEED LOW TEMPERATURE METHOD FOR MANUFACTURING AND REPAIRING SEMICONDUCTOR PROCESSING EQUIPMENT AND EQUIPMENT PRODUCED USING SAME

CROSS-REFERENCE TO RELATED APPLICATIONS

This application is a continuation of U.S. patent application Ser. No. 14/543,376 to Elliot et al., filed Nov. 14, 2014, which is a continuation of U.S. patent application Ser. No. 13/543,727, filed Jul. 6, 2012 to Elliot et al., now U.S. Pat. No. 8,932,690, issued Jan. 13, 2015, which is hereby incorporated by reference in its entirety.

BACKGROUND

Field of the Invention

The present invention relates to a method for manufacturing semiconductor processing equipment and equipment manufactured using such methods.

Description of Related Art

Semiconductor processing and similar manufacturing processes typically employ thin film deposition techniques such as Chemical Vapor Deposition (CVD), Physical Vapor Deposition (PVD), Vapor Phase Epitaxy (VPE), Reactive Ion Etching, and other processing methods. In CVD processing, as well as in other manufacturing techniques, a substrate such as a silicon wafer is secured within a processing chamber using semiconductor processing equipment, such as a heater or an electrostatic chuck, and exposed to the particular processing conditions of the process. The heater or electrostatic chuck is essentially a pedestal that, in addition to securing the substrate, can in some instances also be used to heat the substrate.

As heaters are exposed to high operating temperatures and corrosive process gasses, and because good thermal conductivity is required for good temperature control, prior art heaters have been made from a very limited selection of materials, such as aluminum nitride (AlN) ceramic or PBN, silicon dioxide (quartz), graphite, and various metals such as aluminum alloys, nickel alloys, stainless steel alloys, Inconel, etc. Reactive process gasses which are typically used for semiconductor processing, or chamber cleaning, generally react with heaters made with metal alloys. These reactions can produce corrosive by-products and other effects which can be detrimental to the desired process results. Ceramic materials can be much more resistant to reactions with typical process gasses, and to corrosion from reaction by-products. However, ceramic materials can have limited methods of fabrication due to inherent material properties, and have high manufacturing costs.

The manufacture of semiconductor processing equipment using ceramics, such as heaters and electrostatic chucks with both a ceramic shaft and a ceramic plate, currently involves hot pressing sub-components to partial density, and then again hot pressing an entire assembly until full density is attained. In this type of manufacture, at least two drawbacks are seen. First, the hot pressing/sintering of a large, complex ceramic piece requires a large physical space, and a multiplicity of sequential sintering steps is required. Second, should a portion of the finished piece become damaged, or fail due to wear, there is no repair method available to disassemble the large piece, likely leading to it being scrapped. In the case of manufacture from two or more pieces which have already been pressed to full density, there are also at least two drawbacks. First, after the initial sintering of the major components, these components are typically joined using a liquid phase sintering process to join the major components (in the case of aluminum nitride, for example), which requires high heat, high compressive force, and a significant amount of time in a process oven capable of providing both the high temperatures and the high compressive force. Often the high compressive force applied to a shaft during this sintering to a plate, such as is done in the process of creating a ceramic heater, requires that the annular shaft walls be of thicker cross-sectional thickness than desired in the finished product in order to support these compressive forces. The shaft may then need to be machined down to a final lesser thickness desired to keep heat flow down the shaft to a minimum. Second, should a portion of the finished piece become damaged, or fail due to wear, there is no repair method available to successfully disassemble a large piece that has been joined in this fashion, likely leading to it being scrapped.

An additional concern may be with regard to the repair of these pieces of semiconductor processing equipment, such as heater and electrostatic chucks with plate and shaft elements. Should a portion of a multi-piece assembly of equipment be damaged, such as due to arcing, for example, it may be desirable to dis-assemble the piece of equipment and re-use portions of it. These portions may retain significant financial value. With current methods of manufacturing, for example with regards to ceramic heaters, there is no method available which would allow for the repair of equipment which would allow replacement of some portions and the re-use of some portions of that equipment.

In order to reduce the cost and complexity of manufacturing a ceramic plate and shaft device, such as a heater, a joining method is needed which provides structural joining of the shaft to the plate, as well as a hermetic seal between the atmosphere seen within the shaft and the atmosphere outside of the device. This joint is an important aspect of the entire device, and may become critical in cases where the device is subjected to severe operating conditions such as high temperature, high pressure differences or highly oxidizing or reducing environments which are tolerated by the sintered ceramic bodies themselves. To provide a commercially viable piece of semiconductor processing equipment that uses a joint, the joint is required to maintain mechanical integrity, have compatibility with the sintered ceramic bodies, and retain gas-tightness even when subjected to the operating conditions. Accordingly an ideal joint would meet these requirements, especially during thermal cycling.

It is therefore desired to provide a method of manufacturing semiconductor processing equipment wherein a first sintered body is joined to a second sintered body using a joining process which does not take a significant amount of time, which does not require unduly high temperatures, which is compatible with the process environment chemistries, which results in a joint with a hermetic seal, and in which the joint may be disjoined to allow for repair of the equipment, and reuse of significant, and expensive, portions of it.

SUMMARY OF THE INVENTION

A method for the joining of ceramic pieces into an assembly adapted to be used in semiconductor processing. The joined pieces are adapted to withstand the environments within a process chamber during substrate processing, chamber cleaning processes, and the oxygenated atmosphere which may be seen within the shaft of a heater or electrostatic chuck. The ceramic pieces may be aluminum nitride and the pieces may be brazed with aluminum. The joint material is adapted to withstand both the environments within a process chamber during substrate processing, and the oxygenated atmosphere which may be seen within the shaft of a heater or electrostatic chuck. The joint is adapted to provide a hermetic seal across the joint. The joined pieces are adapted to be separated at a later time should rework or replacement of one of the pieces be desired.

DETAILED DESCRIPTION

In the processing of substrates, many processes require that the substrate be supported by semiconductor processing equipment components, such as a heater or an electro-static chuck. These components may be maintained at, or required to operate in, vacuum conditions, high temperatures, thermal cycling, corrosive atmospheres, and may be damaged during their use during semiconductor manufacturing processes or otherwise. In some aspects, these components may be comprised substantially or comprised fully of a ceramic such as aluminum nitride. The manufacture of these components from such a material has involved costly materials, and is time and equipment intensive, resulting in a very expensive end product.

Prior methods of manufacturing components such as heaters and electrostatic chucks using ceramic materials have required process steps with specialized atmospheres (such as vacuum, inert, or reducing atmospheres), very high temperatures, and very high contact pressures. The contact pressures may be applied using presses, and these presses may be adapted to operate inside a process chamber that provides the specialized atmospheres, such as vacuum, and high temperatures. This may require specialized presses and fixturing made of refractory materials, such as graphite, within the process chamber. The cost and complexity of these setups may be very high. In addition, the larger the component that is required to be pressed, the fewer components can be put into such a process oven. As the duration of the processes in the process ovens with presses may be measured in days, and given the large expense associated with both the manufacture of and the running of the process ovens/presses, a reduction in the number of steps which use these process ovens which provide very high temperature, special atmospheres, and very high contact pressures during the manufacture of components will result in great savings.

Figure 1:
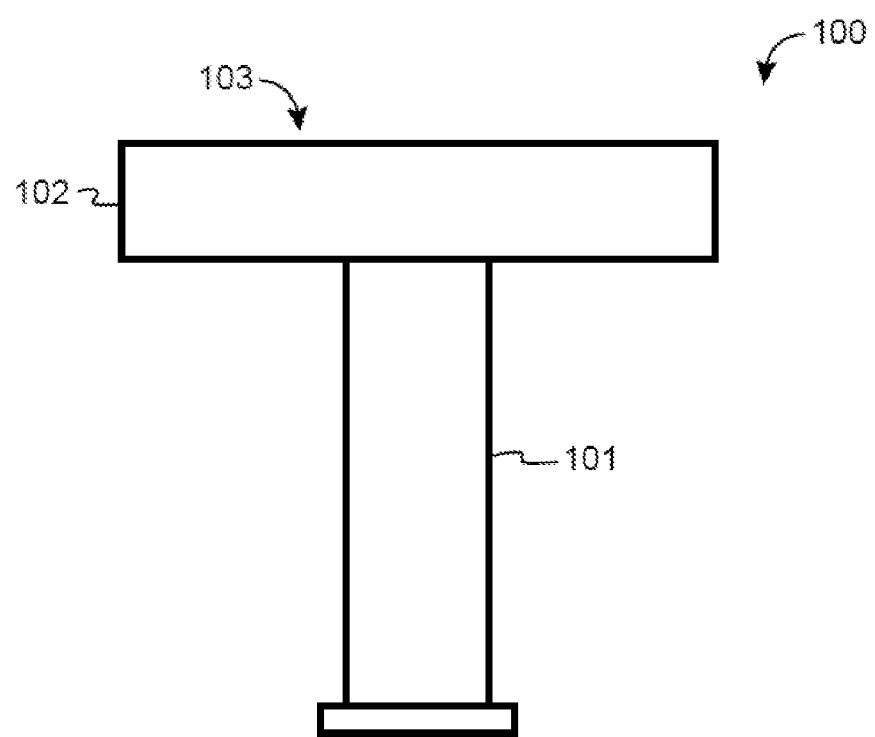
FIG. 1 is a view of a plate and shaft device used in semiconductor processing according to some embodiments of the present invention.
Figure 2:
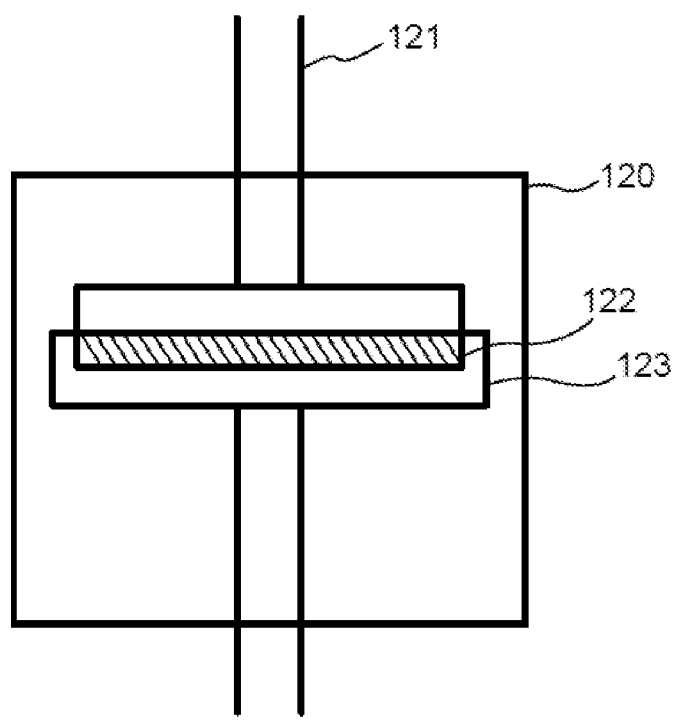
FIG. 2 is a sketch of a high temperature press and oven for a plate according to some embodiments of the present invention.

FIG. 1 illustrates an exemplary plate and shaft device 100, such as a heater, used in semiconductor processing. In some aspects, the plate and shaft device 100 is composed of a ceramic, such as aluminum nitride. Other materials, such as alumina, silicon nitride, silicon carbide or beryllium oxide, may be used. In other aspects the plate may be aluminum nitride and the shaft may be zirconia, alumina, or other ceramic. The heater has a shaft 101 which in turn supports a plate 102. The plate 102 has a top surface 103. The shaft 101 may be a hollow cylinder. The plate 102 may be a flat disc. Other subcomponents may be present. In some present processes, the plate 102 may be manufactured individually in an initial process involving a process oven wherein the ceramic plate is formed. FIG. 2 conceptually illustrates a process oven 120 with a press 121. The plate 122 may be compressed under temperature in a fixture 123 adapted to be pressed by the press 121. The shaft 101 may also be similarly manufactured in a process step. In a typical process, the plate and shaft are formed by loading of aluminum nitride powder incorporating a sintering aide such as yttria at about 4 weight % into a mold, followed by compaction of the aluminum nitride powder into a "solid" state typically referred to as "green" ceramic, followed by a high-temperature liquid-phase sintering process which densities the aluminum nitride powder into a solid ceramic body. The high temperature liquid-phase sintering process may see temperatures in the range of 1700 C and contact pressures in the range of 2500 psi. The bodies are then shaped into the required geometry by standard grinding techniques using diamond abrasives.

There are multiple functions of the shaft: one is to provide vacuum-tight electrical communication through the wall of the vacuum chamber in order to apply electrical power to heater elements as well as a variety of other electrode types which may be embedded within the heater plate. Another is to allow temperature monitoring of the heater plate using a monitoring device such as a thermocouple, and allowing that thermocouple to reside outside of the processing chamber in order to avoid interaction such as corrosion between the materials of the thermocouple and the process chemicals, as well as allowing the thermocouple junction to operate in a non-vacuum environment for rapid response. Another function is to provide isolation of the materials used for the previously mentioned electrical communication from the processing environment. Materials used for electrical communication are typically metallic, which could thereby interact with process chemicals used in the processing environment in ways which could be detrimental to the processing results, and detrimental to the lifetime of the metallic materials used for electrical communication.

Figure 3:
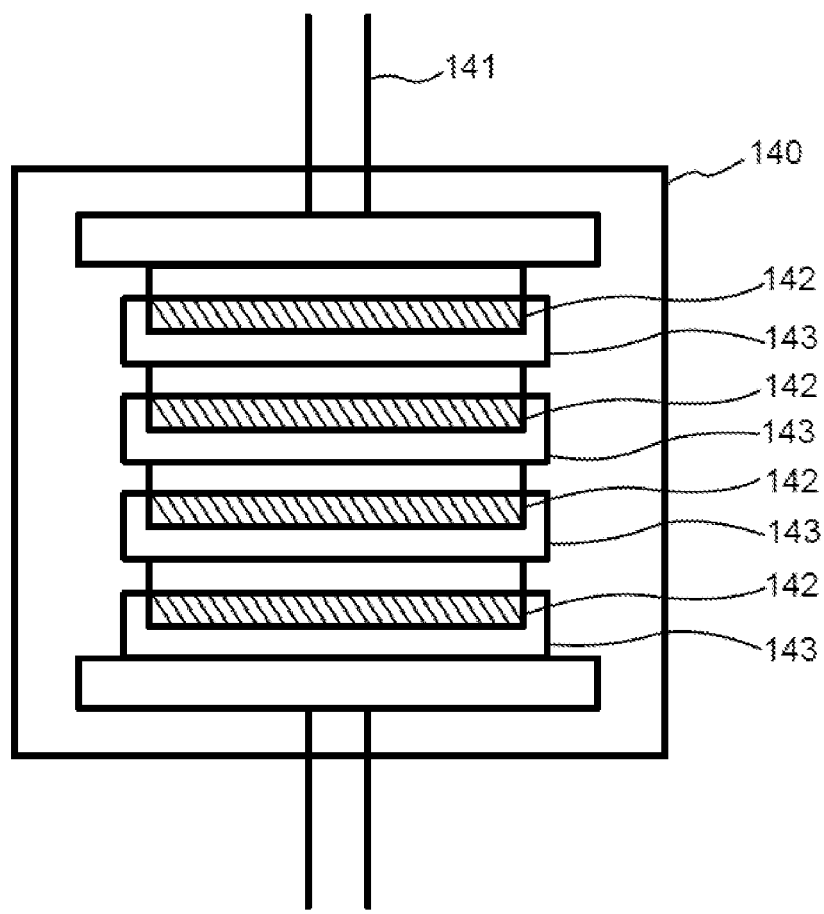
FIG. 3 is a sketch of a high temperature press and oven for a plurality of plates according to some embodiments of the present invention.

Given the relatively flat nature of the plate, a plurality of plates 142 may be formed in a single process by stacking a plurality of plate molding fixtures 143 along the axial direction of the press 141 which resides within the process oven 140, as seen conceptually in FIG. 3. The shafts may also be formed in a similar process using the press in the process oven.

In the overall process of manufacturing a heater used in semiconductor processing both the step of forming plates and forming shafts require significant commitments of time and energy. Given the cost of the specialized high temperature ovens, and that the process steps of forming the plates and forming the shafts each may require the use of a specialized process oven for days, a considerable investment of both time and money has been invested just to get the overall process to the point where the shaft and plate have been completed. Yet a further step in the specialized process oven is required in present processes to affix the plate to the shaft. An example of this step would be to join the shaft to the plate using a liquid phase sintering step in the specialized high temperature process oven with a press. This third step in the specialized process oven also requires significant space in such a process oven as the assembled configuration of the heater includes both the length of the shaft and the diameter of the plate. Although the manufacture of just the shafts may take a similar amount of axial length, the diameter of the shafts is such that multiple shafts may be produced in parallel in a single process.

Figure 4:
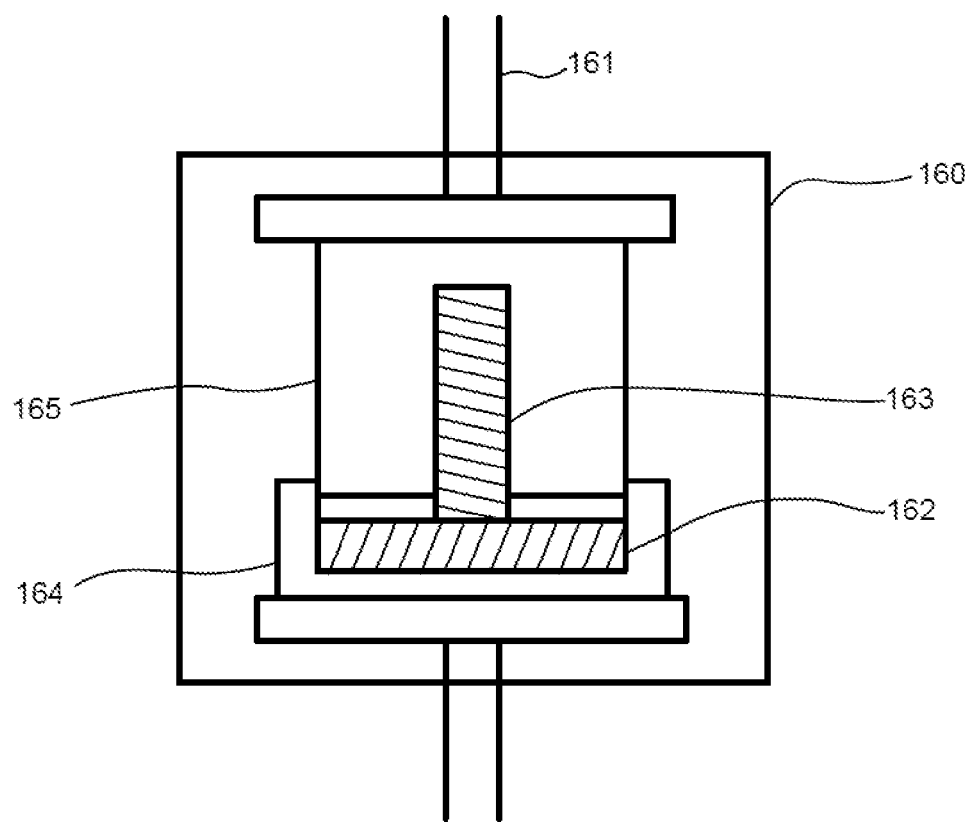
FIG. 4 is a sketch of a high temperature press and oven for a plate and shaft device according to some embodiments of the present invention.

As seen in FIG. 4, the joining process to sinter the shaft to the plate again requires the use of a process oven 160 with a press 161. A set of fixturing 164, 165 is used to position the plate 162 and the shaft 163, and to transmit the pressure delivered by the press 161.

Once the heater is completed, it may be used in semiconductor processing. The heater is likely to be used in harsh conditions, including corrosive gasses, high temperatures, thermal cycling, and gas plasmas. In addition, the heater may be subject to inadvertent impacts. Should the plate or the shaft become damaged, the opportunities for repair of a plate and shaft device joined by liquid phase sintering are limited, perhaps non-existent.

Another prior method for joining ceramic shafts to ceramic plates involves the bolting of the shaft to the plate. Such systems are not hermetic even where the adjoining surfaces are polished to enhance the quality of the seal. A constant positive purge gas pressure is required into the inside of the shaft to reduce process gas infiltration.

An improved method for manufacturing semiconductor processing equipment may involve the joining of a shaft and a plate, which have been described above, into a final joined assembly without the time consuming and expensive step of an additional liquid phase sintering with high temperatures and high contact pressures. The shaft and plate may be joined with a brazing method for joining ceramics. An example of a brazing method for joining together first and second ceramic objects may include the steps of bringing the first and second objects together with a metal binder selected from the group consisting of aluminum and an aluminum alloy disposed between the first and second ceramic objects, heating the metal binder to a temperature of at least 800 C in vacuum, and cooling the metal binder to a temperature below its melting point so that the metal binder hardens and creates a hermetic seal so as to join the first member to the second member. Various geometries of braze joints may be implemented according to methods described herein.

Figure 5A:
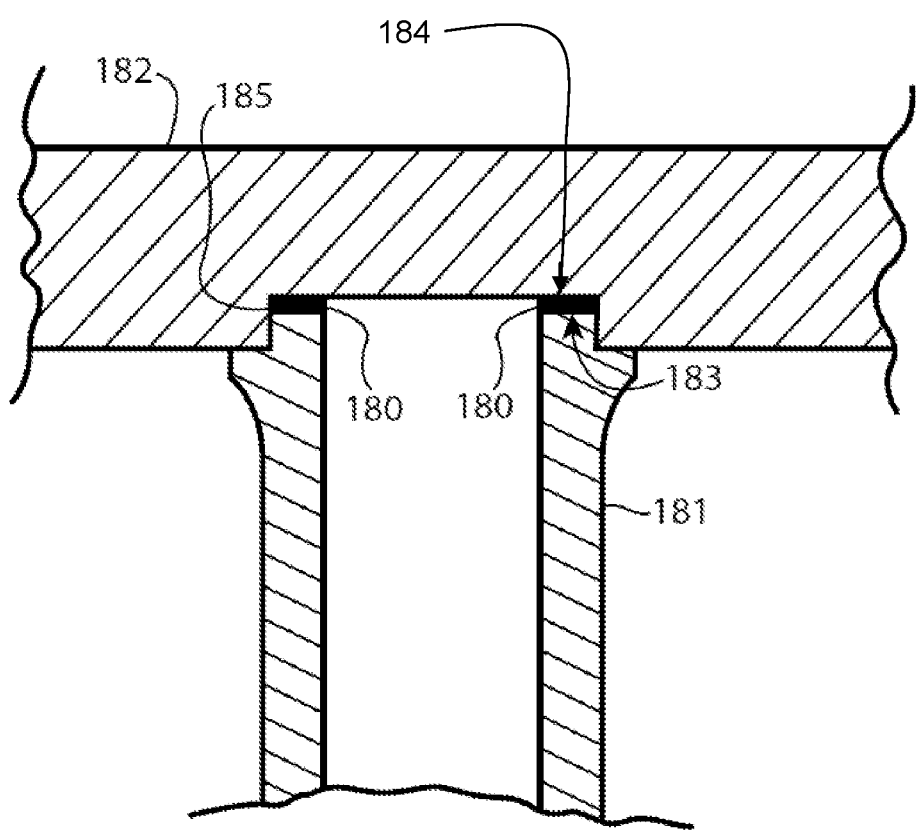
FIG. 5A is a cross-sectional view of a joint between a plate and shaft according to some embodiments of the present invention.

FIG. 5A shows a cross section of a first embodiment of a joint in which a first ceramic object, which may be a ceramic shaft 181, for example, may be joined to a second ceramic object, which may be made of the same or a different material, and which may be a ceramic plate 182, for example. A braze filler material 180 may be included, which can be selected from the combinations of braze materials or binders described herein and may be delivered to the joint according to the methods described herein. With respect to the joint depicted in FIG. 5A, the shaft 181 is positioned such that it abuts the plate, with only the braze filler interposed between the surfaces to be joined, for example end surface 183 of the end 185 of the shaft 181 and an interface surface 184 of the plate 182. The thickness of the joint is exaggerated for clarity of illustration.

Figure 5B:
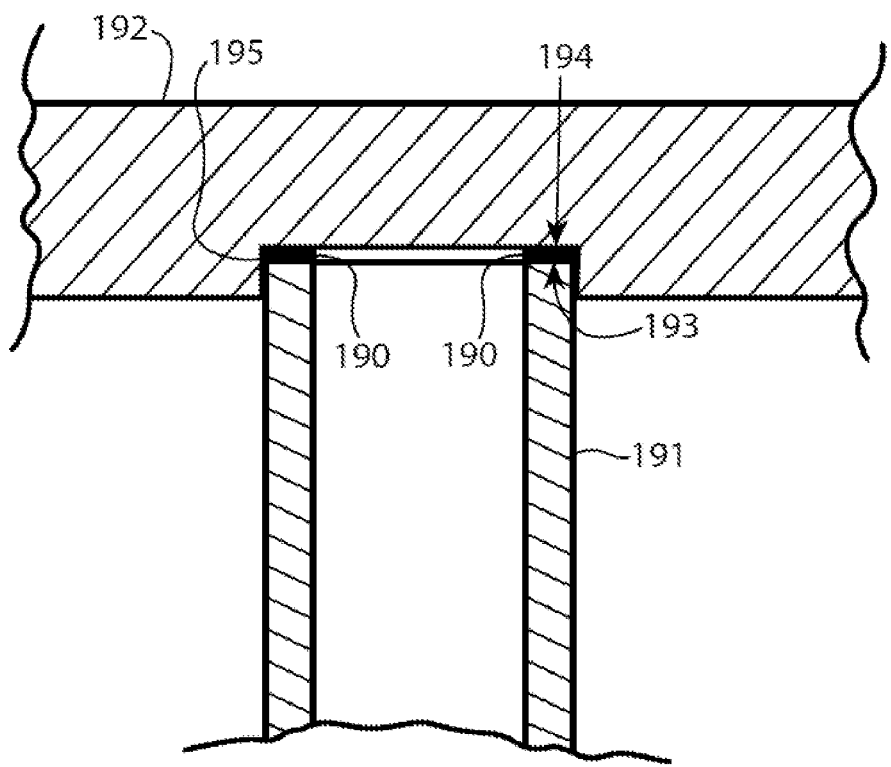
FIG. 5B is a cross-sectional view of a joint between a plate and shaft according to some embodiments of the present invention.

FIG. 5B shows a cross section of a second embodiment of a joint in which a first ceramic object, which may be a ceramic shaft 191, for example, may be joined to a second ceramic object, which may be made of the same or a different material, and which may be a ceramic plate 192, for example. A joining material, such as braze filler material 190, may be included, which can be selected from the combinations of braze materials or binders described herein and may be delivered to the joint according to the methods described herein. With respect to the joint depicted in FIG. 5B, the shaft 191 is positioned such that it abuts the plate, with only the braze filler interposed between the surfaces to be joined, for example surface 193 of the shaft and surface 194 of the plate. The interface surface 194 of the plate 192 may reside in a recess 195 in the plate. The thickness of the joint is exaggerated for clarity of illustration.

Figure 5C:
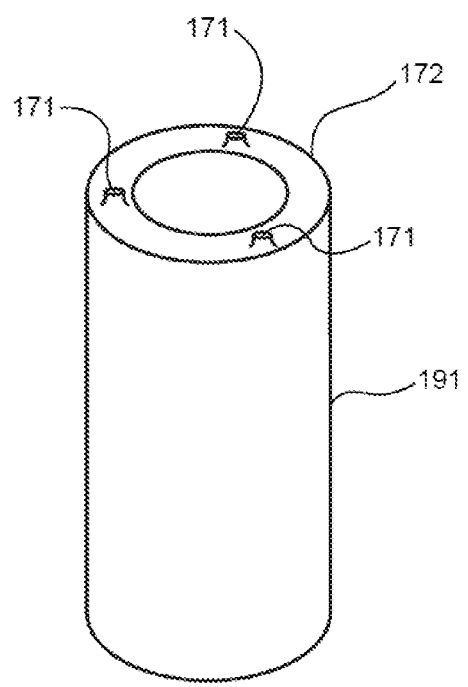
FIG. 5C is a perspective view of a shaft end with mesas according to some embodiments of the present invention.

The embodiments as illustrated in FIGS. 5A and 5B may include a plurality of standoffs adapted to maintain a minimum braze layer thickness. In some embodiments, as seen in FIG. 5C, the shaft 191 may utilize a plurality of mesas 171 on the end 172 of the shaft 191 which is to be joined to the plate. The mesas 171 may be part of the same structure as the shaft 191, and may be formed by machining away structure from the shaft, leaving the mesas. In some embodiments, the mesas may be used to create a minimum braze layer thickness of the remainder of the shaft end 172 from the mating surface of the plate. In some embodiments, the braze filler material, prior to brazing, will be thicker than the distance maintained by the mesas between the shaft end and the plate. With appropriate tolerance control on the interface surface of the plate and of the shaft and mesas, the tolerance control of the finished plate and shaft device may be achieved as the mesas move to contact the plate interface during the brazing step. In some embodiments, other methods may be used to establish a minimum braze layer thickness. In some embodiments, ceramic spheres may be used to establish a minimum braze layer thickness.

Figure 6:
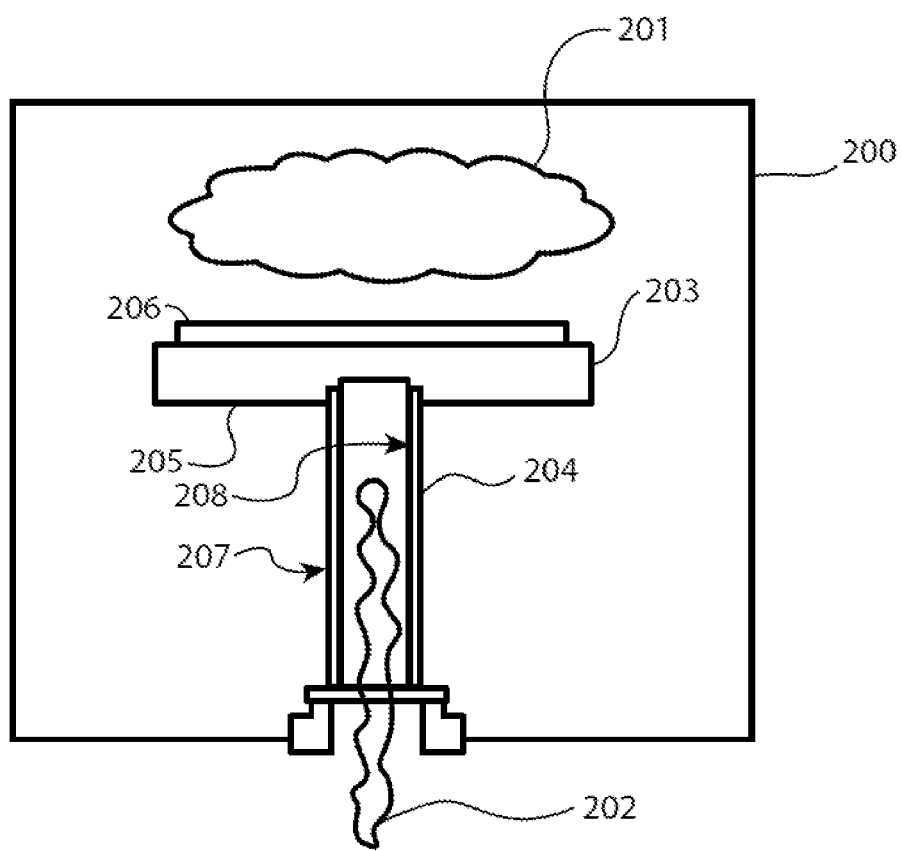
FIG. 6 is a partial cross-sectional view of a plate and shaft device in use in semiconductor manufacturing according to some embodiments of the present invention.

As seen in FIG. 6, the brazing material may bridge between two distinct atmospheres, both of which may present significant problems for prior brazing materials. On an external surface 207 of the semiconductor processing equipment, such as a heater 205, the brazing material must be compatible with the processes occurring in, and the environment 201 present in, the semiconductor processing chamber 200 in which the heater 205 will be used. The heater 205 may have a substrate 206 affixed to a top surface of the plate 203, which is supported by a shaft 204. On an internal surface 208 of the heater 205, the brazing material must be compatible with a different atmosphere 202, which may be an oxygenated atmosphere. Prior brazing materials used with ceramics have not been able to meet both of these criteria. For example, braze elements containing copper, silver, or gold may interfere with the lattice structure of the silicon wafer being processed, and are thus not appropriate. However, in the case of a brazed joint joining a heater plate to a heater shaft, the interior of the shaft typically sees a high temperature, and has an oxygenated atmosphere within the center of a the hollow shaft. The portion of the braze joint which would be exposed to this atmosphere will oxidize, and may oxidize into the joint, resulting in a failure of the hermeticity of the joint. In addition to structural attachment, the joint between the shaft and the plate of these devices to be used in semiconductor manufacturing must be hermetic in many, if not most or all, uses.

A braze material which will be compatible with both of the atmospheres seen on both sides across a joint in such a device is aluminum. Aluminum has a property of forming a self-limiting layer of oxidized aluminum. This layer is generally homogenous, and, once formed, prevents or significantly limits additional oxygen or other oxidizing chemistries (such as fluorine chemistries) penetrating to the base aluminum and continuing the oxidation process. In this way, there is an initial brief period of oxidation or corrosion of the aluminum, which is then substantially stopped or slowed by the oxide (or fluoride) layer which has been formed on the surface of the aluminum. The braze material, or metal binder, may be in the form of a sheet, a powder, a thin film, or be of any other form factor suitable for the brazing processes described herein. For example, the metal binder may be a sheet having a thickness ranging from 0.005 millimeters to 0.300 millimeters. In one embodiment, the braze material may be a sheet in the form of an annular ring having a thickness of approximately 0.006 inches. The mesas may have a mesa standoff height of 0.004 inches. In some embodiments, thicker braze layers are used. Typically, alloying constituents (such as magnesium, for example) in aluminum are formed as precipitates in between the grain boundaries of the aluminum. While they can reduce the oxidation resistance of the aluminum bonding layer, typically these precipitates do not form contiguous pathways through the aluminum, and thereby do not allow penetration of the oxidizing agents through the full aluminum layer, and thus leaving intact the self-limiting oxide-layer characteristic of aluminum which provides its corrosion resistance. In the embodiments using an aluminum alloy which contains constituents which can form precipitates, process parameters, including cooling protocols, would be adapted to minimize the precipitates in the grain boundary. For example, in one embodiment, the metal binder or filler may be aluminum having a purity of at least 99.5%. In some embodiments, a commercially available aluminum foil, which may have a purity of greater than 89%, may be used. In some embodiments, alloys are used. These alloys may include Al-5w % Zr, Al-5w % Ti, commercial alloys #6061, #7005, #5083, and #7075. These alloys may be used with a joining temperature in the range of 1100 C-1200 C. These alloys may be used with a lower temperature in some embodiments.

Figure 7:
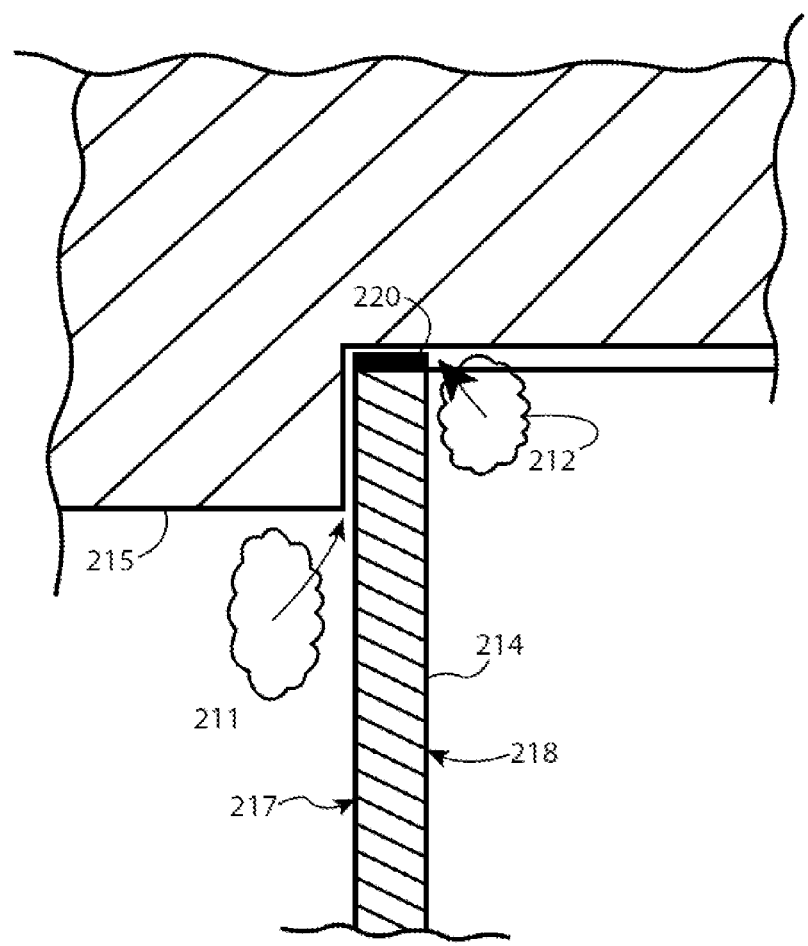
FIG. 7 is a close-up cross-sectional view of a joint between and shaft and a plate according to some embodiments of the present invention.

FIG. 7 illustrates a joint 220 used to join a plate 215 to a shaft 214 according to some embodiments of the present invention. The joint 220 has created a structural and hermetic joint which structurally supports the attachment of the plate 215 to the shaft 214. The joint 220 has created a hermetic seal which isolates the shaft atmosphere 212 seen by the interior surface 218 of the shaft 214 from the chamber atmosphere 211 seen along the exterior surface 217 of the shaft 214 and within the process chamber. The joint 220 may be exposed to both the shaft atmosphere and the chamber atmosphere and must therefore be able withstand such exposure without degradation which may result in the loss of the hermetic seal. In this embodiment, the joint may be aluminum and the plate and the shaft may be ceramic such as aluminum nitride. In some embodiments, the joint 220 may be of aluminum, and which substantially remains in the joint region after the joining process. The residual aluminum may allow for disjoining of the joint for repair, rework, or other reasons.

Figure 8:
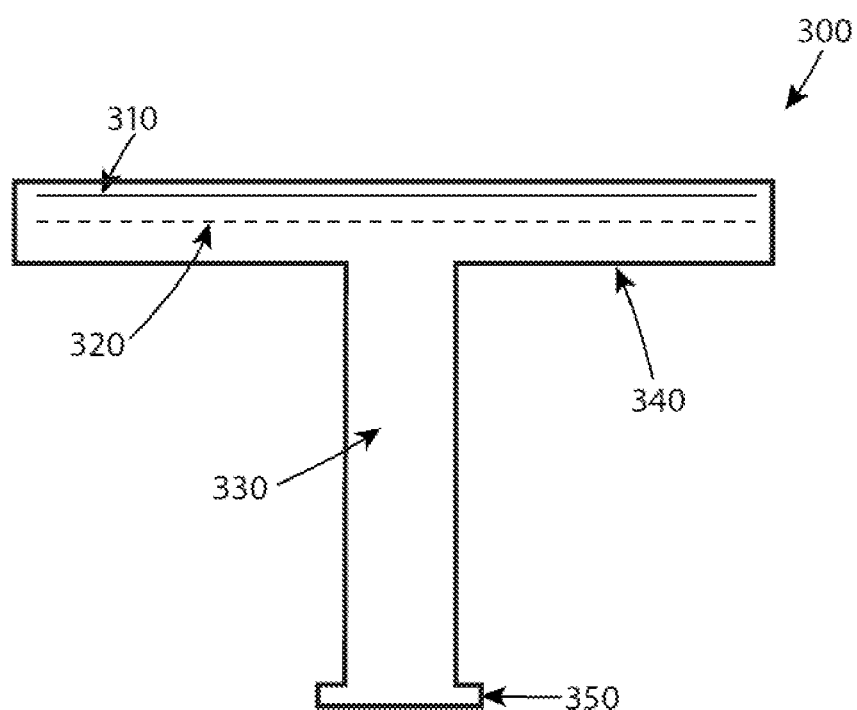
FIG. 8 is view of a plate and shaft device according to some embodiments of the present invention.

FIG. 8 shows one embodiment of a schematic illustration of a heater column used in a semiconductor processing chamber. The heater 300, which may be a ceramic heater, can include a radio frequency antenna 310, a heater element 320, a shaft 330, a plate 340, and a mounting flange 350. One embodiment of a brazing method for joining together a shaft 330 and a plate 340, both or either one of which may be made of aluminum nitride, to form the heater 300 may be implemented as follows. In some embodiments, a poly-crystalline AlN is used, and is comprised of 96% AlN and 4% Yttria. Such a ceramic may be used in industrial applications because during the liquid phase sintering used to manufacture the ceramic, a lower temperature may be used. The lower temperature process, in contrast to polycrystalline AlN without a sintering aide, reduces manufacturing costs of the ceramic. The poly-crystalline AlN with added Yttria may also have preferred material properties, such a being less brittle. Yttria and other dopants are often used for manufacturability and tuning of material properties. With a poly-crystalline AlN such as 96% AlN-4% Yttria ceramic, the ceramic presents grains of AlN which are interspersed with yttrium aluminate. When this ceramic is presented with aluminum, such as joining layers according to some embodiments of the present invention, at higher temperature such as above the liquidus temperature of Al, the Al brazing material may react with the yttrium aluminate resulting in the dislodging and release of some of the AlN grains at the surface of the ceramic. The AlN grains themselves do not react with the aluminum joining layer, nor is diffusion of the aluminum into the AlN grains seen. The non-susceptibility of AlN to diffusion with aluminum under the conditions of processes according to embodiments of the present invention results in the preservation of the material properties, and the material identity, of the ceramic after the brazing step in the manufacturing of the plate and shaft assembly.

A sheet of aluminum or aluminum alloy metal binder or filler may be provided between the shaft and the plate, and the shaft and the plate may be brought together with the sheet of the metal binder disposed therebetween. The metal binder or filler may then be heated in a vacuum to a temperature of at least 800 C and cooled to a temperature below 600 C so that the metal binder or filler hardens and creates a hermetic seal joining the shaft to the plate. The shaft of said heater may be of solid material or it may be hollow in conformation.

In an exemplary embodiment, the plate and shaft may both be of aluminum nitride and both have been separately formed previously using a liquid phase sintering process. The plate may be approximately 9-13 inches in diameter and 0.5 to 0.75 inches thick in some embodiments. The shaft may be a hollow cylinder which is 5-10 inches long with a wall thickness of 0.1 inches. As previously seen in FIG. 5A, the plate 182 may have a recess 185 adapted to receive an outer surface of a first end of the shaft 181. As previously seen in FIG. 5C, mesas may be present on the end of the shaft which abuts the plate. The mesas may be 0.004 inches high. The plate 182 and shaft 181 may be fixtured together for a joining step with a brazing material 180 of aluminum foil placed between the pieces along the end of the shaft and within the recess of the plate. The brazing material may be 0.006 inches thick prior to brazing with a completed joint minimum thickness of 0.004 inches. The brazing material may be aluminum with 0.4 Wt. % Fe.

The fixturing may put a contact pressure of approximately 2-200 psi onto the joint contact area. In some embodiments the contact pressure may be in the range of 2-40 psi. The contact pressure used at this step is significantly lower than that seen in the joining step using hot pressing/sintering as seen in prior processes, which may use pressures in the range of 2000-3000 psi. With the much lower contact pressures of the present methods, the specialized presses of the previous methods are not needed. The pressures needed for the joining of the plate to the shaft using the present methods may be able to be provided using simple fixturing, which may include a mass placed onto the fixturing using gravity to provide the contact pressure. In some embodiments, contact between the interface portion of the shaft and the brazing element, as well as contact between the interface portion of the plate and the brazing element, will provide contact pressure sufficient for joining. Thus, the fixture assembly need not be acted upon by a press separate from the fixture assembly itself. The fixtured assembly may then be placed in a process oven. The oven may be evacuated to a pressure of 1×10E−5 Torr. In some aspects, vacuum is applied to remove residual oxygen. In some embodiments, a vacuum of lower than 1×10E−4 Torr is used. In some embodiments, a vacuum of lower than 1×10E−5 Torr is used. Of note with regard to this step is that the high temperature oven with high contact pressure fixturing, which was required during the manufacture of the ceramic components (shaft and plate), is not needed for this joining of the shaft and plate. Upon initiating the heating cycle, the temperature may be raised slowly, for example 15 C per minute to 200 C and then 20 C per minute thereafter, to standardized temperatures, for example, 600 C and the joining temperature, and held at each temperature for a fixed dwell time to allow the vacuum to recover after heating, in order to minimize gradients and/or for other reasons. When the braze temperature has been reached, the temperature can be held for a time to effect the braze reaction. In an exemplary embodiment, the dwell temperature may be 800 C and the dwell time may be 2 hours. In another exemplary embodiment, the dwell temperature may be 1000 C and the dwell time may be 15 minutes. In another exemplary embodiment, the dwell temperature may be 1150 and the dwell time may be 30-45 minutes. In some embodiments, the dwell temperature does not exceed a maximum of 1200 C. In some embodiments, the dwell temperature does not exceed a maximum of 1300 C. Upon achieving sufficient braze dwell time, the furnace may be cooled at a rate of 20 C per minute, or lower when the inherent furnace cooling rate is less, to room temperature. The furnace may be brought to atmospheric pressure, opened and the brazed assembly may be removed for inspection, characterization and/or evaluation.

In some aspects, the brazing element is brought to a temperature above the melting (liquidus) temperature under a controlled atmosphere, which may be a vacuum. At the desired brazing temperature, the brazing element then flows over the substrate surfaces adjoining the filler material (wetting) and forming the basis of the desired joint. A vacuum ambient helps insure that residual gas existing in the joint region is removed insuring a more complete wetting of the joint surfaces including infusion of the liquid filler into any contours, pores, crevices, and readily accessible intergranular spaces that may exist in the surfaces of the parts comprising the final joined item.

The wetting and flow of the brazing layer may be sensitive to a variety of factors. The factors of concern include the braze material composition, the ceramic composition, the composition of the ambient atmosphere during the joining process, which includes the level of oxygen in the chamber during the joining process, the temperature, the time at temperature, the thickness of the braze material, the surface characteristics of the material to be joined, the geometry of the pieces to be joined, and the physical pressure applied across the joint during the joining process.

In some embodiments, the plate and shaft may comprise different ceramics. The plate may be adapted to provide a high conductive heat coefficient, whereas the shaft may be adapted to provide a lower conductive heat coefficient such that heat is not lost down the shaft towards the mounting appurtenances of the process chamber. For example, the plate may be made of aluminum nitride and the shaft may be made of zirconia.

Figure 9:
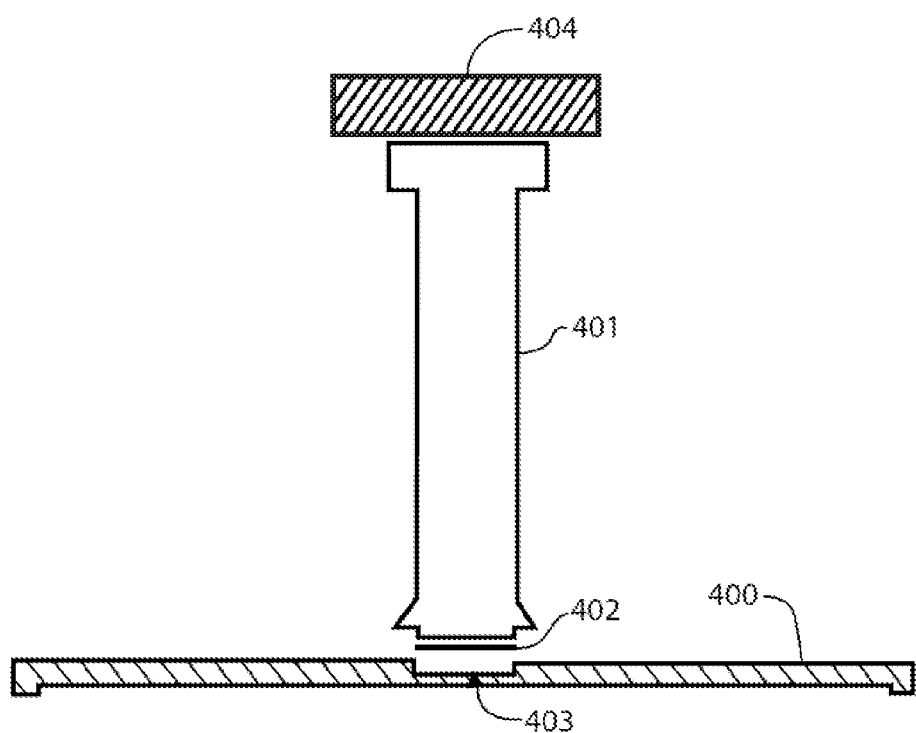
FIG. 9 is an illustration of plate and shaft ready for assembly according to some embodiments of the present invention.
Figure 10:
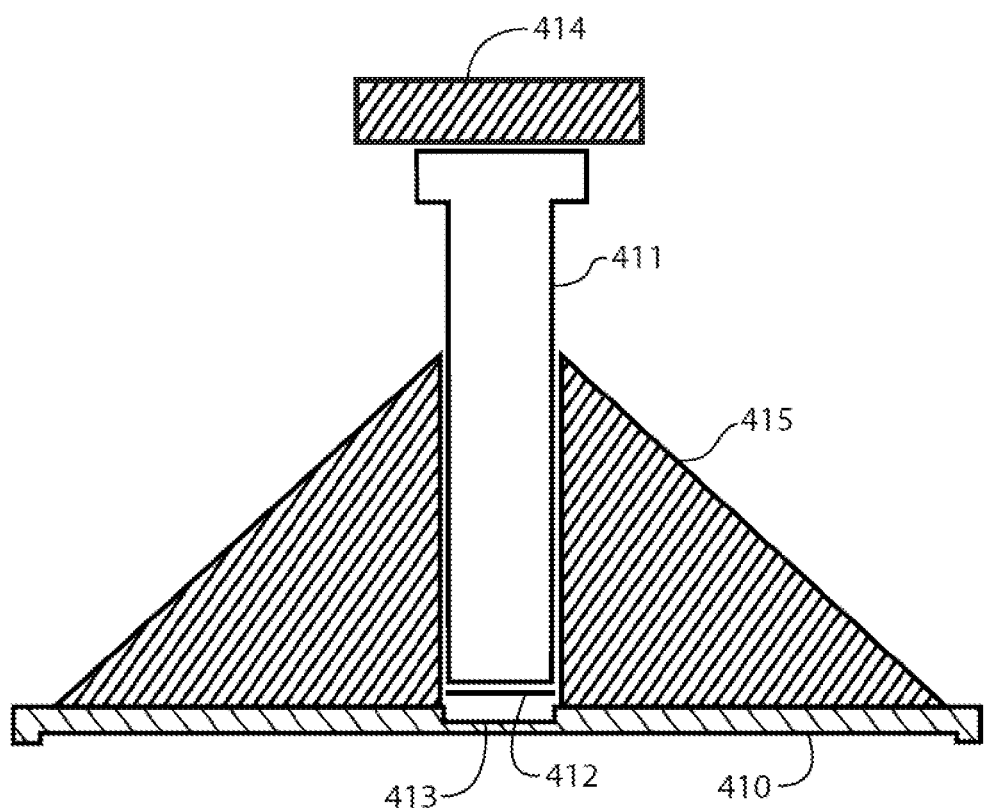
FIG. 10 is an illustration of plate and shaft with fixturing ready for assembly according to some embodiments of the present invention.
Figure 11:
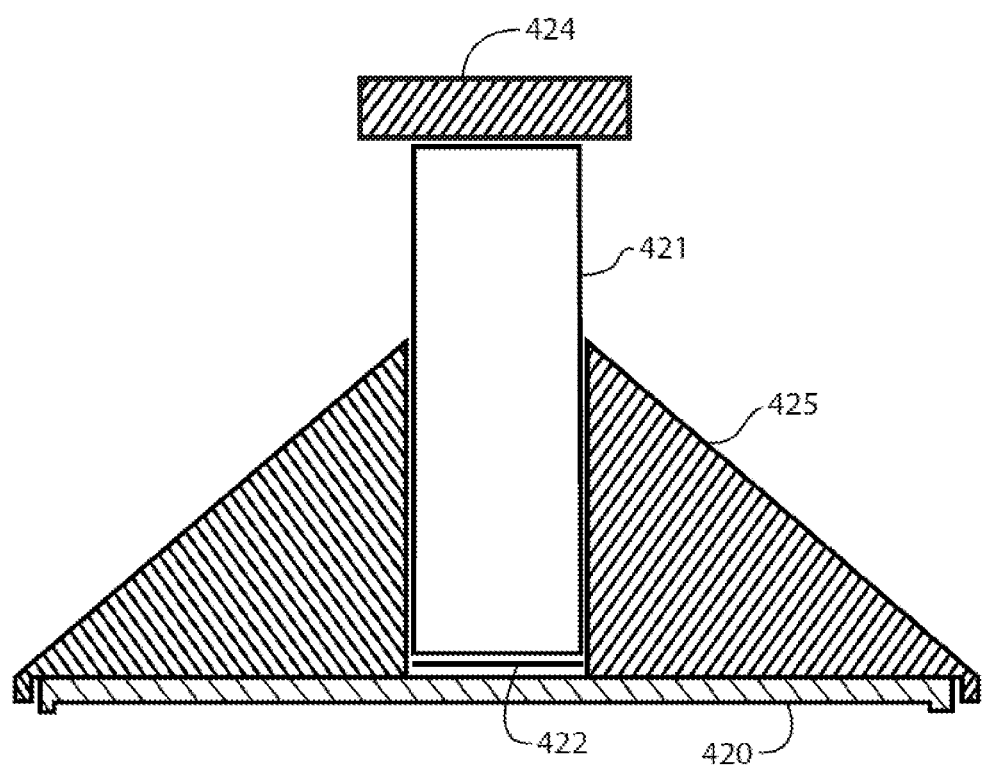
FIG. 11 is an illustration of plate and shaft with fixturing ready for assembly according to some embodiments of the present invention.

FIGS. 9-11 illustrate a joining process which may join a shaft to a plate according to some embodiments of the present invention. The joining process may be run in a process oven with lower temperatures, contact pressures, and lower time and cost commitments than in previous joining operations.

In some embodiments, as seen in FIG. 9, alignment and location of the shaft and plate is maintained by part geometries, eliminating fixturing and post-bond machining. Weighting may be used to insure there is no movement during bonding process, other than some axial movement as the braze material melts. The plate 400 may be placed top down with a joining element 402 within a recess 403 in the back surface of the plate 400. The shaft 401 may be inserted vertically downward into the recess 403 within the plate 400. A weight 404 may be placed on the shaft 401 to provide some contact pressure during the joining process.

In some embodiments, as seen in FIG. 10, location of the shaft and plate is maintained by part geometries, reducing post-bond machining. Fixturing may be required to maintain perpendicularity between shaft and plate during bond processing. In some embodiments, the tolerancing of the mesas and the interface portion of the plate may be used to control the dimensions and tolerances of the final assembly. Weighting may also be used to insure there is no movement during bonding process, other than some axial movement as the braze material melts. The plate 410 may be placed top down with a joining element 412 within a recess 413 in the back surface of the plate 410. The shaft 411 may be inserted vertically downward into the recess 413 within the plate 410. A fixture 415 is adapted to support and locate the shaft 411. A weight 414 may be placed on the shaft 411 to provide some contact pressure during the joining process. In some embodiments, a weight is not used. In some embodiments, the mass of the items to be joined may provide force, with gravity, to apply pressure between the items to be joined.

In some embodiments, as seen in FIG. 11, location and perpendicularity of shaft/plate is maintained by fixturing. Fixturing may not be precise due to thermal expansion and machining tolerances—therefore, post-bond machining may be required. The shaft diameter may be increased to accommodate required material removal to meet final dimensional requirements. Again, weighting may be used to insure there is no movement during bonding process, other than some axial movement as the braze material melts. The plate 420 may be placed top down with a joining element 422 above the back surface of the plate 420. The shaft 421 may be placed onto the plate 420 to create a plate and shaft pre-assembly. A fixture 425 is adapted to support and locate the shaft 421. The fixture 425 may be keyed to the plate to provide positional integrity. A weight 424 may be placed on the shaft 411 to provide some contact pressure during the joining process.

An aspect of the current invention is the maximum operating temperature of the bonded shaft-plate as defined by the decreasing tensile strength, with temperature, of the aluminum or aluminum alloy selected for the joining. For example, if pure aluminum is employed as the joining material, the structural strength of the bond between the shaft and plate becomes quite low as the temperature of the joint approaches the melting temperature of the aluminum, generally considered to be 660 C. In practice, when using 99.5% or purer aluminum, the shaft-plate assembly will withstand all normal and expected stresses encountered in a typical wafer processing tool to a temperature of 600 C. However, some semiconductor device fabrication processes require temperatures greater than 600 C.

Figure 12:
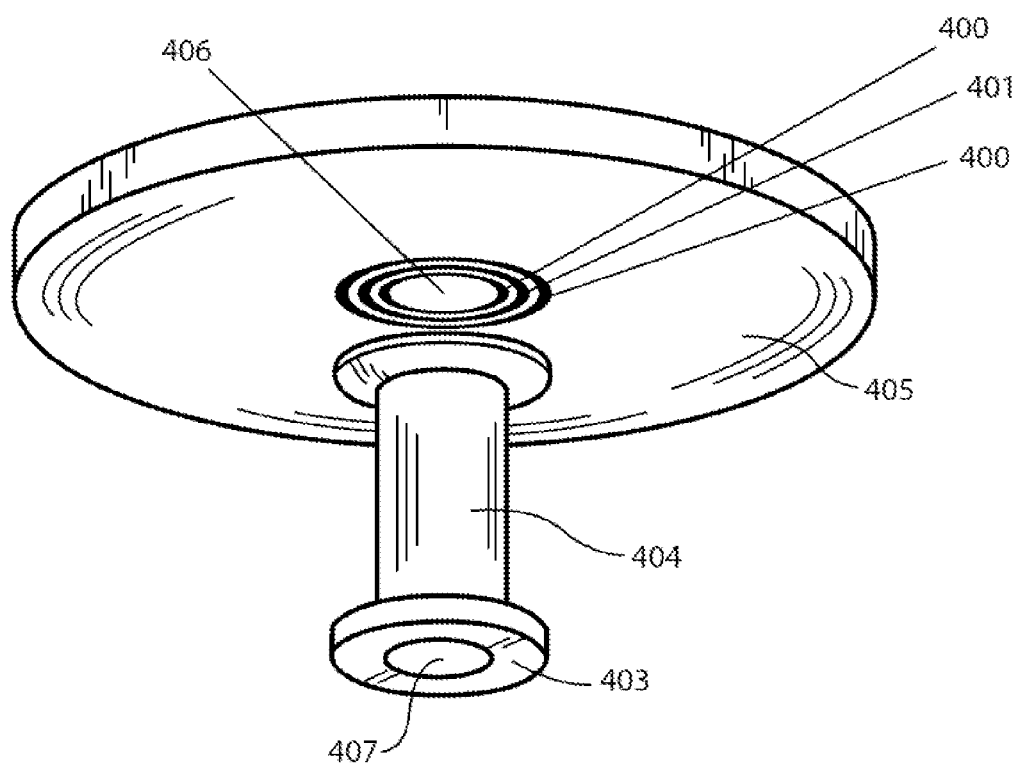
FIG. 12 is an exploded view of a plate and shaft assembly with multiple concentric joining layers according to some embodiments of the present invention.

A further embodiment of the present invention is seen in FIG. 12. As has been disclosed, aluminum or aluminum alloy material, 400, may be used to join the shaft 404 to the plate 405 in a hermetic fashion. Further, another joining material 401 that has both the ability to bond with AlN and a higher melting temperature than aluminum, that is, greater than 660 C, may be used as a structural bond to extend the usable temperature of the shaft-plate assembly to higher temperatures. For example, a titanium-nickel alloy has been demonstrated to bond to aluminum nitride at a temperature within the bonding temperature range used for aluminum as previously described. Other titanium and zirconium alloys may be used as well, many of them containing silver, copper, or gold as alloying elements. Because of their higher melting temperatures, the use of these alloys extends the usable temperature range of the shaft-plate assembly to 700 C or 800 C or 900 C. However, as previously discussed, the elements silver, copper, and gold may be detrimental to the crystalline structure of wafers and must be isolated from the process environment with extreme care. In a similar fashion, titanium and zirconium are easily and detrimentally oxidized when exposed to air at temperatures typically used in wafer process. A solution is to use aluminum "guard bands" around the structural joining material, one band disposed to the process side if necessary to prevent the migration of detrimental elements to the wafer, and one band disposed to the atmosphere side to prevent oxidation of the titanium or zirconium structural bond. In some embodiments, there may be a guard band on only the inner or only the outer side of the joint of other material. In some embodiments, the concentric joints may be at different elevations, in that the end of the shaft has a plurality of plateaus wherein the joints are placed.

As seen in FIG. 12, a flange 403 is hermetically sealed, usually with an elastomeric O-ring, to the process chamber base (not shown). Electrical connections for heating or electrostatic chucking or RF conduction are routed through the shaft center 407 and connect to the plate in the central area 406. Typically the electrical connections and shaft center are in an ambient (air) environment.

After the step of joining the plate to the shaft, the shaft and/or the plate may undergo further machining in the completion of the finished piece. The pressures required to achieve the liquid-phase sintering necessary for typical previous plate-shaft joining required mechanical strengths higher than those provided by typical finish dimensions of heater shafts, as the components needed to withstand the high forces associated with the high pressures of the previous joining process. Therefore, to reduce cracking failures during the bonding process, thicker ceramic sections may have been used for the shaft than are needed in the final configuration. Final required dimensions are then achieved by grinding the bonded plate/shaft assembly after bonding. Although the plate and shaft assemblies of the present invention may undergo some further machining after joining in some embodiments, in other embodiments this is not required. The elimination of the need to utilize thick shafts to withstand forces of high contact pressure joining of shafts and plates, as was required is past methods, removes another time consuming and costly process step from the manufacture of plate and shaft assemblies in processes according to embodiments of the present invention.

Another advantage of the joining method as described herein is that joints made according to some embodiments of the present invention may allow for the disassembly of components, such as the shaft and the plate, if desired, to repair or replace one of those two components. For example, should a plate become damaged due to arc discharge, the plate may be removed from the assembly and replaced. This will allow the cost savings associated with the re-use of a shaft, for example. Also, with an inventory of shafts and plates on hand, a replacement heater may be assembled without need for a high temperature, high pressure process, as the replacement component and the previously used component may be joined according to embodiments of the present invention. Similarly, should the joint, which is both structural and hermetic, lose its hermeticity, the joint may be repaired.

A repair procedure for the unjoining of an assembly which has been joined according to embodiments of the present invention may proceed as follows. The assembly may be placed in a process oven using a fixture adapted to provide a tensile force across the joint. The fixturing may put a tensile stress of approximately 2-30 psi onto the joint contact area. The fixtured assembly may then be placed in a process oven. The oven may be evacuated, although it may not be required during these steps. The temperature may be raised slowly, for example 15 C per minute to 200 C and then 20 C per minute thereafter, to standardized temperatures, for example 400 C, and then to a disjoining temperature. Upon reaching the disjoining temperature, the pieces may come apart from each other. The disjoining temperature may be specific to the material used in the brazing layer. The disjoining temperature may be in the range of 600-800 C in some embodiments. The disjoining temperature may be in the range of 800-1000 C in some embodiments. The fixturing may be adapted to allow for a limited amount of motion between the two pieces such that pieces are not damaged upon separation. The disjoining temperature may be material specific. The disjoining temperature may be in the range of 450 C to 660 C for aluminum.

Prior to the re-use of a previously used piece, such as a ceramic shaft, the piece may be prepared for re-use by machining the joint area such that irregular surfaces are removed. In some embodiments, it may be desired that all of the residual brazing material be removed such that the total amount of brazing material in the joint is controlled when the piece is joined to a new mating part.

In contrast to joining methods which create diffusion layers within the ceramic, joining processes according to some embodiments of the present invention do not result in such a diffusion layer. Thus, the ceramic and the brazing material retain the same material properties after the brazing step that they had prior to the brazing step. Thus, should a piece be desired to be re-used after disjoining, the same material and the same material properties will be present in the piece, allowing for re-use with known composition and properties.

It is appreciated that other components for use in a vacuum chamber may be joined or repaired according to the methods described herein or contemplated hereby, including the specific method described above. Although the processes described above have been primarily with regard to ceramic heaters, it should be understood that other equipment, such as electrostatic chucks, vacuum chucks, and others, may also be manufactured using processes according to embodiments of the present invention.

As evident from the above description, a wide variety of embodiments may be configured from the description given herein and additional advantages and modifications will readily occur to those skilled in the art. The invention in its broader aspects is, therefore, not limited to the specific details and illustrative examples shown and described. Accordingly, departures from such details may be made without departing from the spirit or scope of the applicant's general invention.

What is claimed is:

1. A plate and shaft device used in semiconductor processing, said plate and shaft device comprising:
   a plate, said plate comprising a first ceramic, said plate comprising a joining interface surface of said first ceramic;
   a shaft, said shaft comprising a second ceramic, said shaft comprising an interior space and an exterior, said shaft comprising a joining interface surface of said second ceramic, said shaft coupled to a bottom surface of said plate;
   a first metal joining layer directly disposed between said joining interface surface of said plate and said joining interface surface of said shaft, wherein said first metal joining layer hermetically seals said interior space of said shaft from said exterior of said shaft through said first metal joining layer, said first metal joining layer comprising aluminum,
   wherein the conductive heat coefficient of said first ceramic is higher than the conductive heat coefficient of said second ceramic.

2. The plate and shaft device of claim 1 wherein said first ceramic comprises aluminum nitride and said second ceramic comprises zirconia.

3. The plate and shaft device of claim 1 wherein said first metal joining layer comprises greater than 89% by weight aluminum.

4. The plate and shaft device of claim 1 wherein said first metal joining layer comprises greater than 89% by weight aluminum.

5. The plate and shaft device of claim 2 wherein said first metal joining layer comprises greater than 99% by weight aluminum.

6. The plate and shaft device of claim 2 wherein said first metal joining layer comprises greater than 99% by weight aluminum.

7. A plate and shaft device used in semiconductor processing, said plate and shaft device comprising:
   a plate, said plate comprising aluminum nitride, said plate comprising a joining interface surface of aluminum nitride;
   a shaft, said shaft comprising aluminum nitride, said shaft comprising an interior space and an exterior, said shaft comprising a joining interface surface of aluminum nitride, said shaft coupled to a bottom surface of said plate;
   a first metal joining layer directly disposed between said joining interface surface of said plate and said joining interface surface of said shaft, wherein said first metal joining layer hermetically seals said interior space of said shaft from said exterior of said shaft through said first metal joining layer, said first metal joining layer comprising aluminum, wherein said first metal joining layer comprises greater than 99% by weight aluminum.

* * * * *